United States Patent
Satoh (10) Patent No.: US 7,973,290 B2
(45) Date of Patent: Jul. 5, 2011

(54) SYSTEM AND METHOD OF BEAM ENERGY IDENTIFICATION FOR SINGLE WAFER ION IMPLANTATION

(75) Inventor: Shu Satoh, Byfield, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 407 days.

(21) Appl. No.: 12/190,736

(22) Filed: Aug. 13, 2008

(65) Prior Publication Data

US 2010/0038553 A1 Feb. 18, 2010

(51) Int. Cl.
*H01J 3/14* (2006.01)
*H01J 3/26* (2006.01)
*G21K 5/10* (2006.01)

(52) U.S. Cl. .............. 250/397; 250/396 R; 250/492.1; 250/492.3

(58) Field of Classification Search ............ 250/306, 250/396 R, 397, 491.1, 492.1, 492.21, 492.3
See application file for complete search history.

(56) References Cited

U.S. PATENT DOCUMENTS

| | | | |
|---|---|---|---|
| 4,667,111 A | 5/1987 | Glavish et al. | |
| 4,922,106 A | 5/1990 | Berrian et al. | |
| 5,091,655 A | 2/1992 | Dykstra et al. | |
| 5,716,742 A * | 2/1998 | Doran | 430/22 |
| 6,423,976 B1 | 7/2002 | Glavish et al. | |
| 6,437,350 B1 | 8/2002 | Olson et al. | |
| 6,831,288 B1 | 12/2004 | Schmitt et al. | |
| 7,078,713 B2 * | 7/2006 | White | 250/492.21 |
| 2006/0169922 A1* | 8/2006 | Chang et al. | 250/492.21 |
| 2008/0283778 A1* | 11/2008 | Tomimatsu et al. | 250/492.21 |
| 2009/0146082 A1* | 6/2009 | Stengl et al. | 250/492.22 |

\* cited by examiner

*Primary Examiner* — Robert Kim
*Assistant Examiner* — Nicole Ippolito Rausch
(74) *Attorney, Agent, or Firm* — Eschweiler & Associates, LLC (57) ABSTRACT

The present invention involves a beam energy identification system, comprising an accelerated ion beam, wherein the accelerated ion beam is scanned in a fast scan axis within a beam scanner, wherein the beam scanner is utilized to deflect the accelerated ion beam into narrow faraday cups downstream of the scanner, wherein a difference in scanner voltage or current to position the beam into the Faraday cups is utilized to calculated the energy of ion beam.

8 Claims, 5 Drawing Sheets

SYSTEM AND METHOD OF BEAM ENERGY IDENTIFICATION FOR SINGLE WAFER ION IMPLANTATION

FIELD OF INVENTION

The present invention relates generally to ion implantation, and particularly to systems and methods for identifying beam energy.

BACKGROUND OF THE INVENTION

Ion implantation is a physical process, as opposed to diffusion, which is a chemical process that is employed in semiconductor apparatus fabrication to selectively implant dopant into a semiconductor workpiece and/or wafer material. Thus, the act of implanting does not rely on a chemical interaction between a dopant and the semiconductor material. For ion implantation, dopant atoms/molecules are ionized and isolated, sometimes accelerated or decelerated, formed into a beam, and swept across a workpiece or wafer. The dopant ions physically bombard the workpiece, enter the surface and typically come to rest below the workpiece surface in the crystalline lattice structure thereof.

In RF based accelerators, ions are repeatedly accelerated through multiple RF voltage driven acceleration gaps. Due to the time varying nature of RF acceleration fields and the multiple numbers of acceleration gaps (usually greater than 20) there are a large number of parameters which influence the final beam energy. Although it may not be technically impossible, "set and forget" techniques can not be used in setting up the final beam energy and fine adjustments have to be performed on the parameters to maximize beam transmission through a filter with known passband.

An energy filter is used not only as a simple filter to reject unwanted portions of the energy spectrum, but also and more importantly as an energy standard to which all the acceleration parameters are tuned. In this sense, the energy filter plays the ultimate role in determining the final beam energy. However, quite often the design of the energy filter has to be compromised, mostly because of space restrictions or some other imposed conditions limiting proper functioning and as a result, precision in the final beam energy is uncertain. There have been several attempts to develop an independent measurement system of beam energy, but no particular method has been incorporated into production machines.

Accordingly, suitable systems or methods for identifying beam energy are desired, that accurately measures the final beam energy.

SUMMARY OF THE INVENTION

The following presents a simplified summary of the invention in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention according to one or more embodiments creates a beam energy identification system utilizing a beam scanner which scans an accelerated ion beam at a frequency to create a wide uniform ion beam in one direction for uniform ion implantation on a workpiece, or a semiconductor wafer. One embodiment of this invention comprises two narrow Faraday cups placed at a distance downstream of scanner and a difference in scanner voltage (or current if the scanner is electromagnetic) to deflect the ion beam into each of the two narrow Faraday cups is used to calculate the energy of ion beam.

According to yet another aspect of the invention, two narrow Faraday cups are placed downstream of a scanner after going through a beam parallelizing lens (e.g., an electromagnetic lens, called an angle corrector magnet) to parallelize the fanning-out beam exiting the scanner. Again, a measured difference in scanner voltage (or current if the scanner is electromagnetic) to deflect the ion beam into each of the two Faraday cups is used to calculate the energy of the ion beam.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
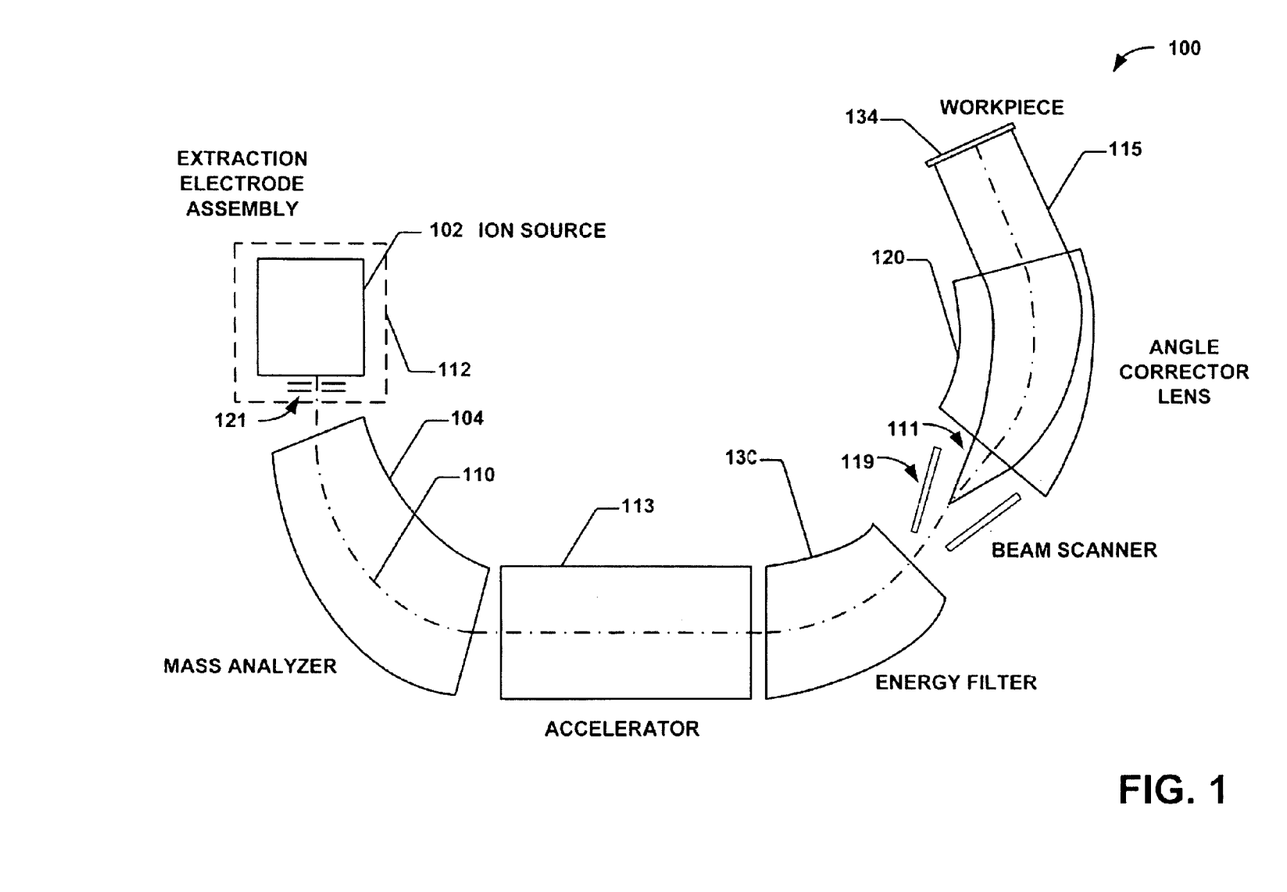
FIG. 1 is a simplified top view illustrating an ion implantation system in accordance with an aspect of the present invention.

The present invention will now be described with reference to the attached drawings, wherein like reference numerals are used to refer to like elements throughout. It will be appreciated by those skilled in the art that the invention is not limited to the exemplary implementations and aspects illustrated and described hereinafter. For the sake of providing a clear description of the invention, the systems and the methods will be described in connection with scanned pencil ion beam implantation. However, it is to be expressly understood that these descriptions are not intended to be self-limiting in any manner Referring now to the figures, in accordance with one exemplary aspect of the present invention, FIG. 1 illustrates a typical hybrid parallel scan single wafer ion implantation system 100. The implantation system 100 is also a type referred to as a post acceleration implanter, since a main accelerator 113 is placed after a mass analyzer 104 and before an energy filter 130. Most ion implanters of this type have the energy filter 130 after the accelerator 113 to remove unwanted energy spectrum in the output of accelerator 113. The filtered ion beam goes through a beam scanner 119 and then through an angle corrector lens 120 to convert the fanned-out beam 111 into a parallel shifted ion beam 115.

A workpiece and/or substrate 134 is moved orthogonal (shown as moving in and out of the paper) to the ion beam 115 in the hybrid scan scheme to irradiate the entire surface of the workpiece 134 uniformly. As stated above, various aspects of the present invention may be implemented in association with any type of ion implantation system, including, but not limited to the exemplary system 100 of FIG. 1.

The exemplary hybrid parallel scan single wafer ion implantation system 100 comprises a source chamber assembly 112 which includes an ion source 102 and an extraction electrode assembly 121 to extract and accelerate ions to an intermediate energy. A mass analyzer 104 removes unwanted ion mass species; the accelerator assembly 113 accelerates the ions to a final energy. The beam scanner 119 scans a pencil beam exiting from the accelerator assembly 113 back and forth at a fast frequency into the angle corrector lens 120 to convert the fanning out scanned beam 111 from the beam scanner 119 to the parallel shifted beam 115 and the workpiece 134 which is housed in a process chamber.

The accelerator assembly 113, for example, can be RF linear particle accelerator (LINAC) in which ions are accelerated repeatedly by an RF field, or a DC accelerator, for example, a tandem electrostatic accelerator, which accelerates ions with a stationary DC high voltage. The beam scanner 119, either electrostatically or electromagnetically scans the ion beam 110 left to right into the angle corrector lens 120, which converts the fanning-out beam 111 into the parallel shifted ion beam 115. The angle corrector lens 120 is most likely to be an electromagnetic magnet as shown, but there is also an electrostatic version, for example. The final parallel shifted ion beam 115 out of the angle corrector lens 120 is directed onto the workpiece 134.

Figure 2:
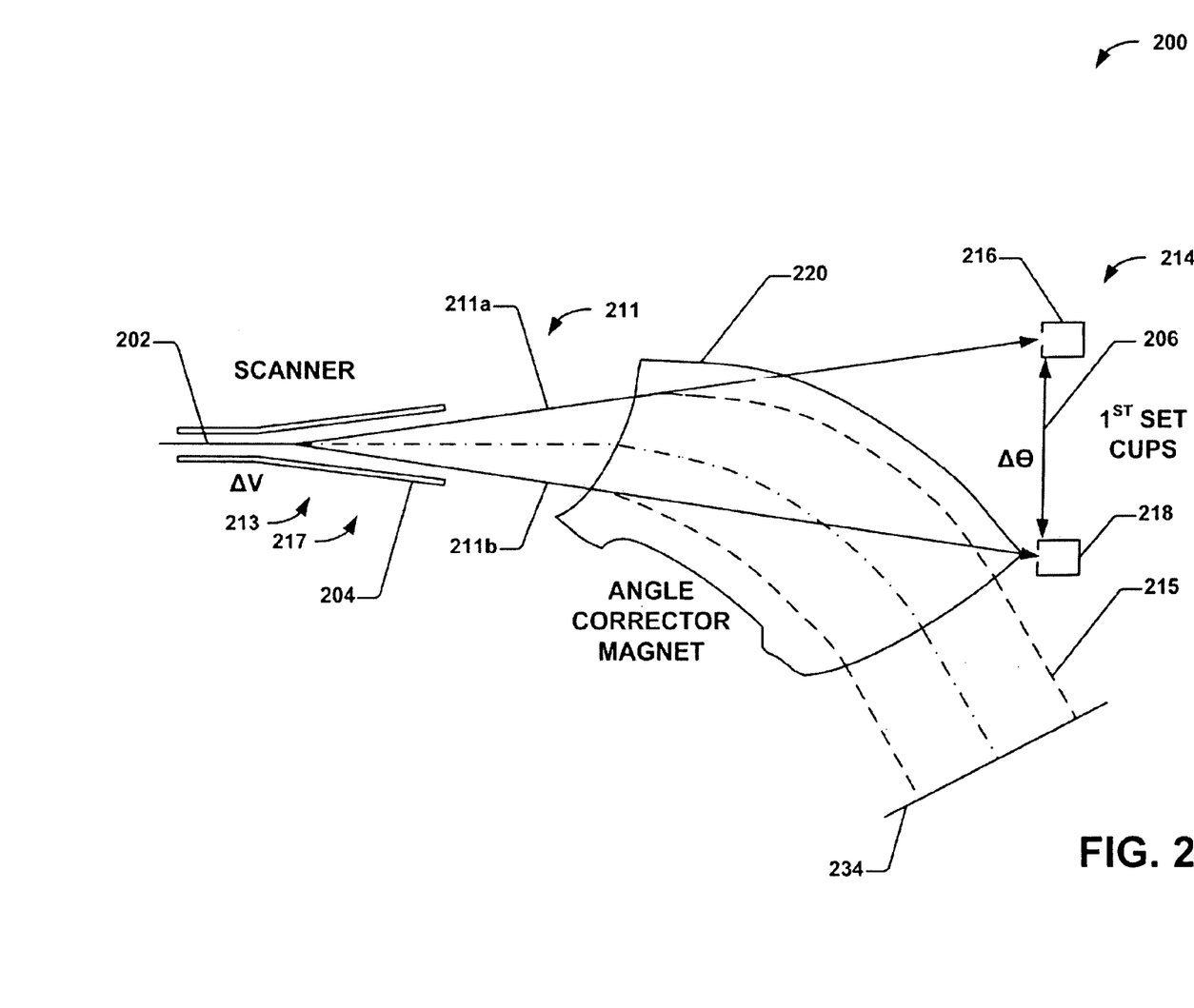
FIG. 2 is a top view illustrating an embodiment of a beam energy identification system in accordance with an aspect of the present invention.

FIG. 2 illustrates a beam energy identification system 200 utilized in an exemplary hybrid parallel scan single wafer ion implantation system 100 (e.g., FIG. 1), wherein a stationary pencil ion beam 202 is scanned with an electrostatic beam scanner 204 in one axis, the fast scan axis (usually greater than 100 Hz), a fanned out beam 211 can be converted to a parallel shifted beam 215 by an angle corrector lens 220, typically an electromagnet (e.g., angle corrector magnet) and a wafer or workpiece 234 is mechanically moved orthogonal to the beam scanning axis. In this type of ion implantation system 100 the electrostatic beam scanner 204 is most often positioned after the ion beam 202 acquires full acceleration energy. The beam scanner 204 can be either electrostatic or electromagnetic, but for simplicity of discussion, it is assumed that the scanner 204 is an electrostatic scanner. For an electromagnetic scanner, the mathematical relationship is slightly more complex than for the electrostatic scanner 204 and it requires knowing the mass of the ions.

For small angles (i.e., angles less than about 10 degrees) the angle of deflection of the ion beam 202 by the electrostatic scanner 204 is a linear function of scan voltage (for an electrostatic scanner) and the inverse of beam energy. The calculation for a deflection angle ($\Delta\theta_{1S}$) is shown below as Equation 1. In this embodiment of the present invention the angle corrector magnet 220 is deactivated which allows the deflected beam 211, deflected by the scanner to pass through the angle corrector magnet 220 without deflection.

$$\Delta\theta_{1S}=(K_{1S})(\Delta V_{1S})/(E/q) \text{ (electrostatic equation)} \quad \text{(Eq. 1)}$$

wherein:

$\Delta\theta_{1S}$ is a change of deflection angle $K_{1S}$ is a constant (of the 1st order) throughout the ranges of the beam energy (E) and scanner voltage ($V_{1S}$)

$\Delta V_{1S}$ is the change in electrostatic scanner voltage

E is the beam energy q is the charge value of the ions

Rearranging the terms described above can be done to determine the beam energy (E), shown below as Equation 2:

$$E=(\Delta\theta_{1S})(q)/((K_{1S})(\Delta V_{1S})) \text{ (electrostatic equation)} \quad \text{(Eq. 2)}$$

Now referring to an electromagnetic scanner 215 (as opposed to an electrostatic scanner 204) the change of beam deflection angle ($\Delta\theta_{1M}$) is shown below as Equation 3. In this embodiment of the present invention the angle corrector magnet 220 is deactivated which allows the scanner deflected beam 211 to pass through the angle corrector magnet 220 without deflection.

$$\Delta\theta_{1M}=(K_{1M})(q)(\Delta B_{1M})/(\text{sqrt}(Em)) \text{ (electromag. eq.)} \quad \text{(Eq. 3)}$$

wherein:

$\Delta\theta_{1M}$ is the change of beam deflection angle;

$K_{1M}$ is constant (of the 1st order) throughout the ranges of the beam energy (E) and a magnetic field in the electromagnetic scanner;

$\Delta B_{1M}$ is the change in the electromagnetic scanner magnetic field;

E is the beam energy;

q is the charge value of the ions; and m is the mass of ions.

Rearranging terms to determine the beam energy (E) is shown below as Equation 4:

$$E=(K_{1M}\Delta B_{1M}q\,\Delta\theta_{1M})^2/m \text{ (electromag. eq.)} \quad \text{(Eq. 4)}$$

Figure 3:
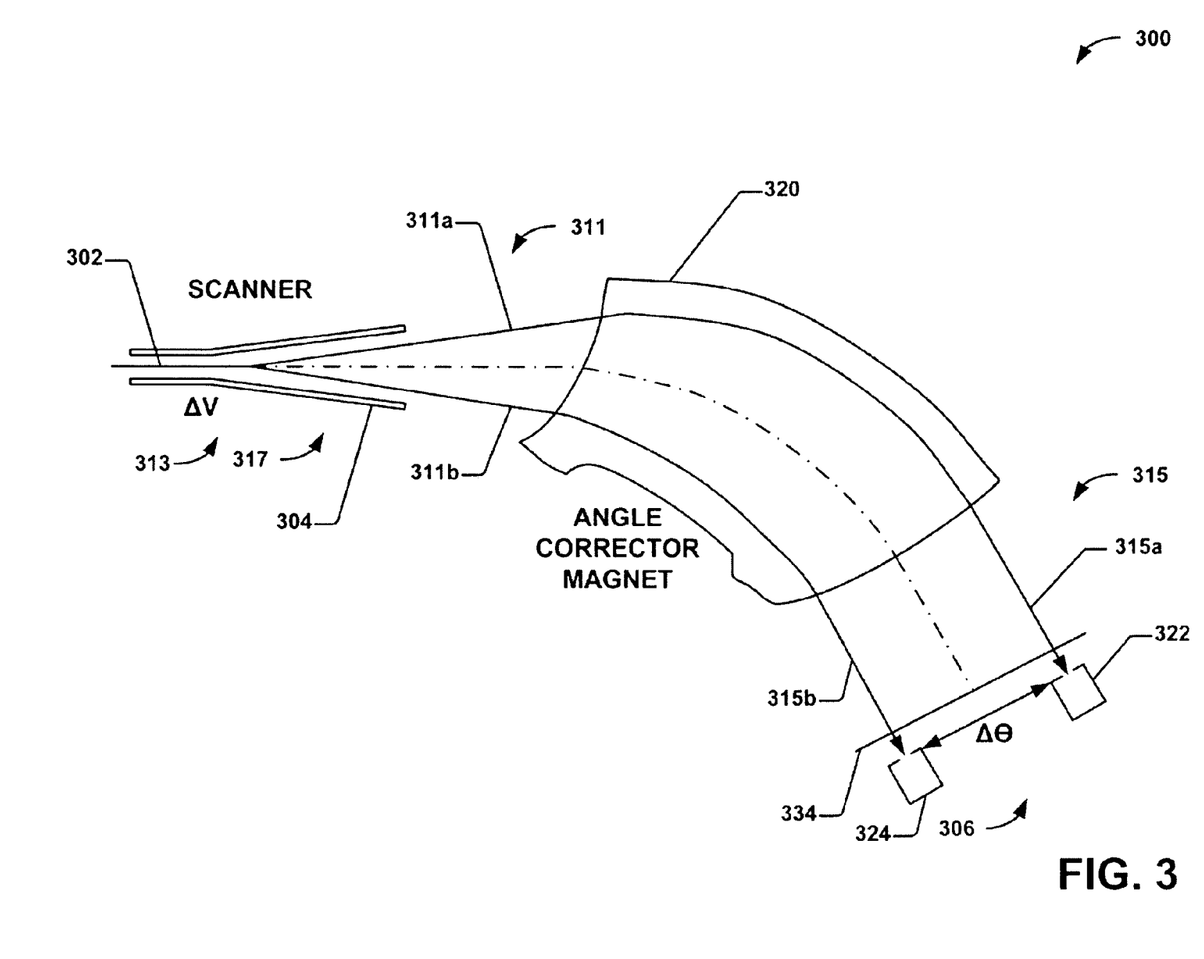
FIG. 3 is a top view illustrating yet another embodiment of a beam energy identification system in accordance with an aspect of the present invention.

Yet another embodiment of the present invention is an ion beam energy identification system 300; depicted in FIG. 3 that can also be used in a hybrid scan single wafer ion implantation system 100. In this kind of system a beam scanner is most often situated after the ion beam 302 acquires full acceleration energy. The primary angle of deflection of the ion beam 202 by the scanner 204 is a linear function shown as Equation 5 that adds an additional correction factor $f_{1M}$.

The system 300 can be utilized in an exemplary hybrid parallel scan single wafer ion implantation system 100 (e.g., FIG. 1), wherein a stationary pencil ion beam 302 is scanned (usually at a frequency greater than 100 Hz) with an electrostatic beam scanner 304 in one axis. In the fast scan axis, a fanned out beam 311 is converted to a parallel shifted beam 315 by activating an angle corrector lens 320, typically an electromagnet (e.g., angle corrector magnet) and a wafer or workpiece 334 is mechanically moved orthogonal to the beam scanning axis. In this type of ion implantation system the beam scanner 304 is most often positioned after the ion beam 302 acquires full acceleration energy. The beam scanner 304 can be either electrostatic or electromagnetic, but for simplicity of discussion, it is first assumed that the scanner 304 is an electrostatic scanner. For an electromagnetic scanner as discussed supra, the mathematical relationship is slightly more complex than for an electrostatic scanner and it requires knowing the mass of the ions.

For small angles (i.e., angles less than about 10 degrees) the angle of deflection of the ion beam 302 by the electrostatic scanner 304 is a linear function of scan voltage (for an electrostatic scanner) and the inverse of the ion beam energy. The calculation for the shift of beam position ($\Delta\theta_{2S}$) is shown below as Equation 5. In this embodiment of the present invention the angle corrector magnet 220 is activated which allows the fanned out beam 211 to be converted into a parallel ion beam 315 as illustrated in FIG. 3.

$$\Delta\theta_{2S}=(f_{2S})(k_{2S})(\Delta V_{2S})/(E/q) \quad \text{(Eq. 5)}$$

wherein:
$\Delta\theta_{2S}$ is the shift of beam position;
$f_{2S}$ is a correction factor to account for effect of corrector magnet;
$K_{2S}$ is approximately constant throughout ranges of the beam energy and electrostatic scanner voltage;
$\Delta V_{2S}$ the change in electrostatic scanner voltage;
E the beam energy; and
q is the charge value of the ions.
Rearranging terms:

$$E=(\Delta\theta_{2S})(q)/((f_{2S})(k_{2S})(\Delta V_{2S}))\quad\text{(Eq. 6)}$$

Now referring to another embodiment of the present invention is an electromagnetic scanner 315 (as opposed to the electrostatic scanner 204) the shift of beam position ($\Delta\theta_{2M}$) is shown below as Equation 7. In this embodiment of the present invention the angle corrector magnet 320 is activated which allows the deflected beam by the scanner 311 to pass through the angle corrector magnet 320 and to be deflected into a parallel ion beam 315.

$$\Delta\theta_{2M}=(f_{2M})(k_{2M})q(\Delta B_{2M})/\sqrt{Em}\quad\text{(Eq. 7)}$$

wherein:
$\Delta\theta_{2M}$ is the shift of beam position;
$f_{2M}$ is a correction factor to account for effect of corrector magnet;
$K_{2M}$ is approximately constant throughout ranges of the beam energy and electromagnetic scanner current;
$\Delta B_{2M}$ the change in magnetic field in the electromagnetic scanner;
E the beam energy;
m is the mass of ions; and
q is the charge value of the ions.
Rearranging terms:

$$E=(qK_{2M}f_{2M}\Delta B_{2M}\Delta\theta_{2M})^2/m\quad\text{(Eq. 8)}$$

Figure 4:
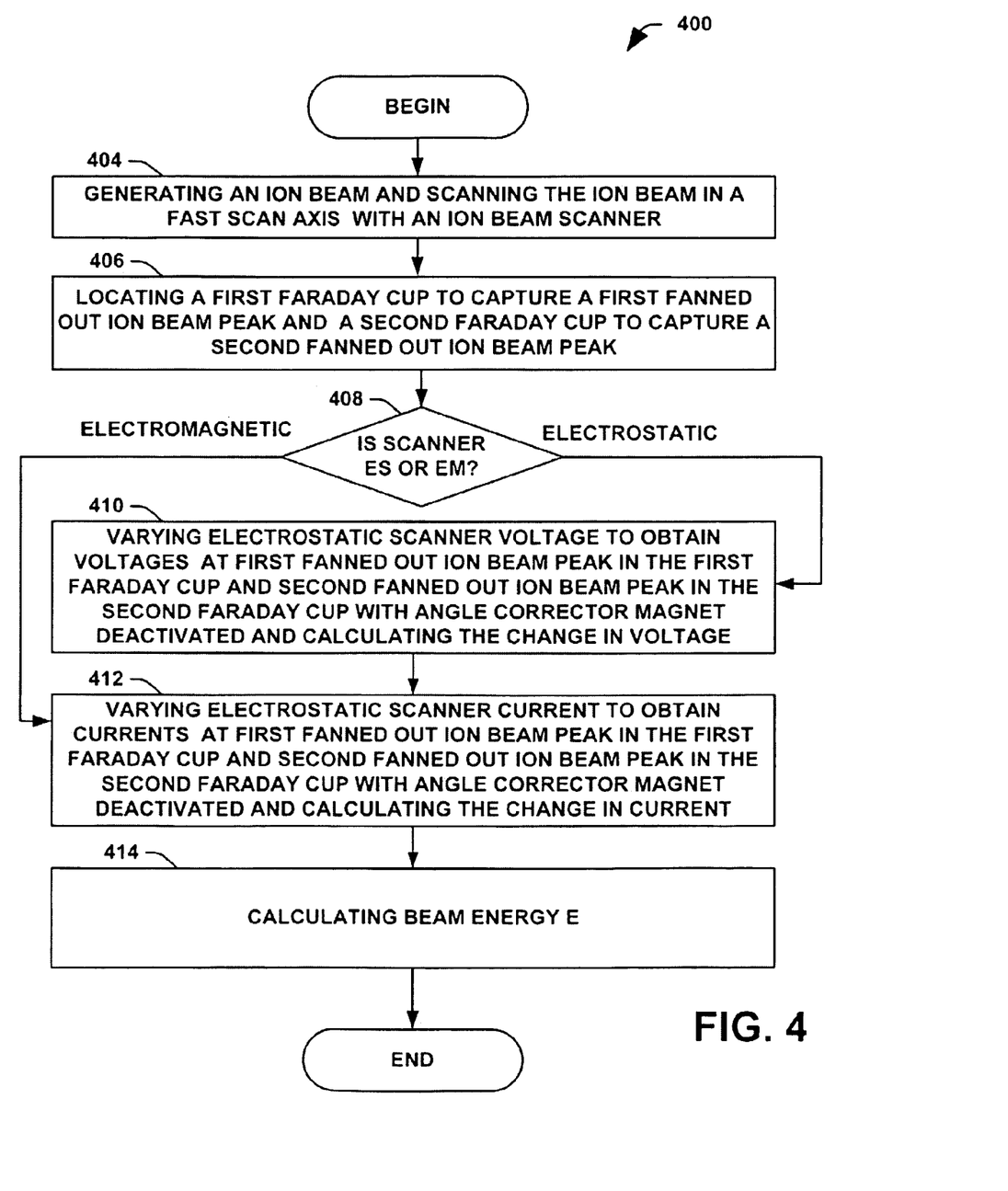
FIG. 4 is a functional block diagram illustrating a beam energy identification method according to yet another embodiment of the present invention.

FIG. 4 illustrates an exemplary method of beam energy identification 400 that will be described in detail with respect to FIG. 2. Although the methodology 400 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated steps may be required to implement a methodology in accordance with the present invention. Furthermore, the methodologies according to the present invention may be implemented in association with the formation and/or processing of structures illustrated and described herein as well as in association with other structures not illustrated.

The method 400 begins at 404 with generating an ion beam 202 and scanning the ion beam 202 in a fast scan axis with an ion beam scanner 204 (e.g., FIG. 2), for example. The ion beam 202 (FIG. 2) is extracted at 404 and scanned at a frequency of greater than 100 Hz. The ion beam 202 in this example is a pencil ion beam; however potential ion beams can be a divergent beam, a ribbon beam, and the like. The ion beam scanner 204 can be an electrostatic ion beam scanner 215 (FIG. 2) or an electromagnetic ion beam scanner 217.

Two or more Faraday cups and/or other type detection mechanism(s) and/or sensors can be employed to detect a deflected ion beam 211 (FIG. 2) and thus ascertain the ion beam energy associated therewith. At 406 a first Faraday cup 216 is located to capture a first deflected ion beam peak 211a and a second Faraday cup 218 is located to capture a second deflected ion beam peak 211b. It is determined at 408 if the scanner is an electrostatic scanner 215 or an electromagnetic scanner 217. If the scanner is the electrostatic scanner 215 the voltage is varied to obtain peak of a first deflected ion beam 211a (FIG. 2) in the first Faraday cup 216 (FIG. 2) and a second deflected ion beam peak 211b (FIG. 2) in the second Faraday cup 218 (FIG. 2). An angle corrector magnet 220 (FIG. 2) is deactivated so that the deflected ion beam 211 by the scanner travels to the Faraday cups 216 and 218 un-deflected. The beam energy (E) is calculated at 414 (FIG. 4) utilizing the change in voltage. Referring to the equation derived previously as Eq. 2.

$$E=(\Delta\theta_{1S})(q)/((K_{1S})(\Delta V_{1S}))\text{ (electrostatic equation)}\quad\text{(Eq. 2)}$$

wherein:
$\Delta\theta_{1S}$ is an shift of beam angle;
$K_{1S}$ is a constant (of the 1st order) throughout the ranges of beam energy ($E_{1S}$) and scanner voltage ($V_{1S}$);
$\Delta V_{1S}$ is the change in electrostatic scanner voltage;
E is the beam energy; and
q is the charge value of the ions.

If it is determined at 408 that the scanner is the electromagnetic scanner 217 the current is varied to obtain the peak of a first deflected ion beam peak 211a (FIG. 2) in the first Faraday cup 216 (FIG. 2) and a second deflected ion beam peak 211b (FIG. 2) in the second Faraday cup 218 (FIG. 2). The angle corrector magnet 220 (FIG. 2) is deactivated so that the deflected ion beam 211 by the scanner travels to the cups 216 and 218 un-deflected. The beam energy (E) is calculated utilizing the change in magnetic field in the scanner at 414. Referring to the equation derived previously as Eq. 4.

$$E=(K_{1M}\Delta B_{1M}q\,\Delta\theta_{1M})^2/m\quad\text{(Eq. 4)}$$

wherein:
$\Delta\theta_{1M}$ is shift of beam angle;
$K_{1M}$ is a constant (of the 1st order) throughout the ranges of the beam energy (E) and scanner current;
$\Delta B_{1M}$ is the change in the magnetic field in electromagnetic scanner;
E is the beam energy
m is the mass of ions; and
q is the charge value of the ions.

Figure 5:
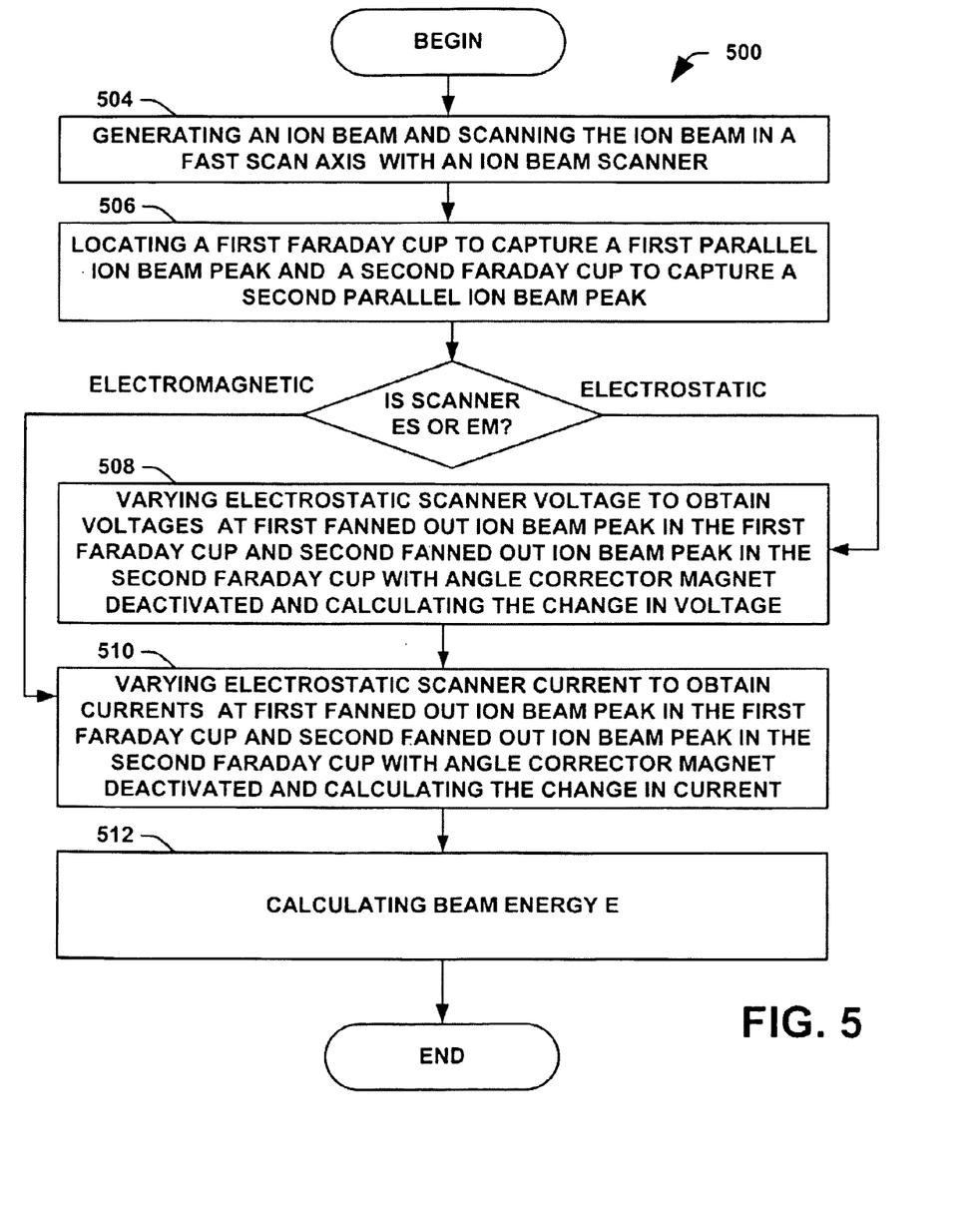
FIG. 5 is a functional block diagram illustrating a beam energy identification method according to another embodiment of the present invention.

FIG. 5 illustrates yet another exemplary method for beam energy identification 500 that will be described in detail with respect to FIG. 3. Although the methodology 500 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated steps may be required to implement a methodology in accordance with the present invention. Furthermore, the methodologies according to the present invention may be implemented in association with the formation and/or processing of structures illustrated and described herein as well as in association with other structures not illustrated.

The method 500 begins at 504 with generating an ion beam 302 and scanning the ion beam 302 in a fast scan axis with an ion beam scanner 304 (e.g., FIG. 3), for example. The ion beam 302 (FIG. 3) is extracted at 504 and scanned at a frequency of greater than 100 Hz. The ion beam 302 in this example is a pencil ion beam; however potential ion beams can be a divergent beam, a ribbon beam, and the like. The ion beam scanner 304 can be an electrostatic ion beam scanner 315 (FIG. 3) or an electromagnetic ion beam scanner 317.

Two or more Faraday cups and/or other type detection mechanism(s) and/or sensors can be employed to detect a parallel ion beamlets created from the parallel ion beam 315 (FIG. 3) and thus ascertain the ion beam energy associated therewith. At 506 a first faraday cup 322 is located to capture a first parallel ion beam peak 315a and a second faraday cup 324 is located to capture a second parallel ion beam peak 315b. It is determined at 508 if the scanner 304 is an electrostatic scanner 313 or an electromagnetic scanner 317. If the scanner 304 is an electrostatic scanner 313 the voltage is varied to obtain a first parallel ion beam peak 315a (FIG. 3) in the first Faraday cup 322 (FIG. 3) and a second parallel ion beam peak 315b (FIG. 3) in the second Faraday cup 324 (FIG. 3). An angle corrector magnet 320 (FIG. 3) is activated so that the parallel ion beam 315 travels to the cups 322 and 324. The ion beam energy (E) is calculated at 514 (FIG. 5) utilizing the change in scanner voltage. Referring to the equation derived previously as Eq. 6.

$$E=(\Delta\theta_{2S})(q)/((f_{2S})(k_{2S})(\Delta V_{2S})) \text{ (electrostatic equation)} \quad \text{(Eq. 6)}$$

wherein:
$\Delta\theta_{2S}$ is the second electrostatic shift of beam position;
$f_{2S}$ is a correction factor to account for effect of corrector magnet;
$K_{2S}$ is approximately constant throughout ranges of the second electrostatic beam energy 2 and electrostatic scanner voltage;
$\Delta V_{2S}$ the second change in electrostatic scanner voltage;
E the beam energy; and
q is the charge value of the ions.

Wherein, the method 500 ends if the scanner was the electrostatic scanner 313.

If it is determined at 508 that the scanner 304 (FIG. 3) is an electromagnetic scanner 317 the current is varied to obtain a parallel ion beam peak 315a (FIG. 3) in the first Faraday cup 322 (FIG. 3) and a second parallel ion beam peak 315b (FIG. 3) in the second Faraday cup 324 (FIG. 3). The angle corrector magnet 320 (FIG. 3) is activated so that the parallel ion beam 315 travels to the cups 322 and 324. The beam energy (E) is calculated utilizing the change in current at 514. Referring to the equation derived previously as Eq. 8.

$$E=(K_{2M}\Delta B_{2M}q\,\Delta\theta_{2M})^2/m \text{ (electromagnetic equation)} \quad \text{(Eq. 8)}$$

wherein:
$\Delta\theta_{2M}$ is the shift of beam position;
$K_{2M}$ is a constant (of the 1st order) throughout the ranges of a beam energy (E) and scanner current;
$\Delta B_{2M}$ is the change in a magnetic field of the electromagnetic scanner;
E is a beam energy; and
q is a charge value of the ions.

Wherein, the method 500 ends if the scanner is an electromagnetic scanner 317.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, apparatus, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A beam energy identification system, comprising:
an electrostatic beam scanner configured to receive an ion beam, wherein the ion beam is deflected along a fast scan axis via a variation of a scanner voltage applied to the electrostatic beam scanner, therein defining a scanned ion beam;
a first Faraday cup positioned along the fast scan axis; and
a second Faraday cup positioned along the fast scan axis, wherein the scanner voltage is measured when a peak of the scanned ion beam is present at the respective first Faraday cup and second Faraday cup, and wherein a beam energy (E) is defined by:

$E=(\Delta\theta_{1S}q)/(K_{1S}\Delta V_{1S})$, wherein:

$\Delta\theta_{1S}$ a shift of angle of the scanned ion beam;
q is a charge value of ions of the scanned ion beam;
$K_{1S}$ is a constant throughout ranges of beam energy and scanner voltage; and
$\Delta V_{1S}$ is a difference in scanner voltages associated with the respective peaks of the scanned ion beam at the first Faraday cup and the second Faraday cup.

2. A beam energy identification system, comprising:
an electromagnetic beam scanner configured to receive an ion beam, wherein the ion beam is deflected along a fast scan axis via a variation of a scanner current applied to the electromagnetic beam scanner, therein defining a scanned ion beam;
a first Faraday cup positioned along the fast scan axis; and
a second Faraday cup positioned along the fast scan axis, wherein the scanner current is measured when a peak of the scanned ion beam is present at the respective first Faraday cup and second Faraday cup, and wherein a beam energy (E) is defined by:

$E=(K_{1M}\Delta B_{1M}q\Delta\theta_{1M})^2/m$, wherein:

$K_{1M}$ is constant throughout ranges of beam energy and scanner current;
$\Delta B_{1M}$ is a difference in a scanner magnetic field associated with the respective peaks of the scanned ion beam at the first Faraday cup and the second Faraday cup;
q is a charge value of ions of the scanned ion beam;
$\Delta\theta_{1M}$ is a shift of angle of the scanned ion beam; and
m is a mass of the ions of the scanned ion beam.

3. The beam energy identification system of claim 2, further comprising an angle corrector magnet positioned downstream of the electromagnetic beam scanner, wherein the angle corrector magnet is configured to selectively parallelize the scanned ion beam.

4. A beam energy identification system, comprising:
an electrostatic beam scanner configured to receive an ion beam, wherein the ion beam is deflected along a fast scan axis via a variation of a scanner voltage applied to the electrostatic beam scanner, therein defining a scanned ion beam;
an angle corrector magnet positioned downstream of the electrostatic beam scanner, wherein the angle corrector magnet is configured to parallelize the scanned ion beam, therein defining a parallel shifted ion beam;

a first Faraday cup positioned along the fast scan axis; and a second Faraday cup positioned along the fast scan axis, wherein the scanner voltage is measured when a peak of the parallel shifted ion beam is present at the respective first Faraday cup and second Faraday cup, and wherein a beam energy (E) is defined by:

$$E=(\Delta\theta_{2S}q)/(f_{2S}K_{2X}\Delta V_{2S}), \text{ wherein:}$$

$\Delta\theta_{2S}$ is a shift of angle of the parallel shifted ion beam;

q is a charge value of ions of the parallel shifted ion beam;

$f_{2S}$ is a correction factor to account for an effect of the angle corrector magnet;

$K_{2S}$ is a constant throughout ranges of the beam energy and scanner voltage; and $\Delta V_{2S}$ is a difference in scanner voltages associated with the respective peaks of the parallel shifted ion beam at the first Faraday cup and the second Faraday cup.

5. A beam energy identification system, comprising:

an electromagnetic beam scanner configured to receive an ion beam, wherein the ion beam is deflected along a fast scan axis via a variation of a scanner current applied to the electromagnetic beam scanner, therein defining a scanned ion beam;

an angle corrector magnet positioned downstream of the electromagnetic beam scanner, wherein the angle corrector magnet is configured to parallelize the scanned ion beam, therein defining a parallel shifted ion beam;

a first Faraday cup positioned along the fast scan axis; and a second Faraday cup positioned along the fast scan axis, wherein the scanner voltage is measured when a peak of the parallel shifted ion beam is present at the respective first Faraday cup and second Faraday cup, and wherein a beam energy (E) is defined by:

$$E=(K_{2M}\Delta B_{2M}q\Delta\theta_{2M})^2/m, \text{ wherein:}$$

$K_{2M}$ is constant throughout ranges of the beam energy and scanner current;

$\Delta B_{2M}$ is a difference in a scanner magnetic field associated with the respective peaks of the parallel shifted ion beam at the first Faraday cup and the second Faraday cup;

q is a charge value of ions of the parallel shifted ion beam;

$\Delta\theta_{2M}$ is a shift of angle of the parallel shifted ion beam; and m is a mass of the ions of the parallel shifted ion beam.

6. A method for identifying an energy of an ion beam, the method comprising:

scanning the ion beam along a fast scan axis via an application of a scanner voltage to an ion beam scanner, therein defining a scanned ion beam;

positioning a first faraday cup downstream of the ion beam along the fast scan axis;

positioning a second faraday cup downstream of the ion beam scanner along the fast scan axis;

determining a shift of angle of the scanned ion beam, wherein the shift angle is associated with a position of the ion beam scanner relative to the first Faraday cup and second Faraday cup;

varying the scanner voltage and determining the scanner voltage when a first peak and a second peak of the scanned ion beam is present at the respective first Faraday cup and second Faraday cup; and determining a beam energy (E) of the scanned ion beam, wherein the beam energy is defined by:

$$E=(\Delta\theta_{1S}q)/(K_{1S}\Delta V_{1S}), \text{ wherein:}$$

$\Delta\theta e_{1S}$ is the shift of angle of the scanned ion beam;

q is a charge value of ions of the scanned ion beam;

$K_{1S}$ is a constant throughout ranges of beam energy and scanner voltage; and $\Delta V_{1S}$ is a difference in scanner voltages associated with the respective first and second peaks of the scanned ion beam at the first Faraday cup and the second Faraday cup.

7. A method for identifying an energy of an ion beam, the method comprising:

scanning the ion beam along a fast scan axis via an application of a scanner voltage to an ion beam scanner, therein defining a scanned ion beam;

positioning a first Faraday cup downstream of the ion beam scanner along the fast scan axis;

positioning a second Faraday cup downstream of the ion beam scanner along the fast scan axis;

activating an angle corrector magnet positioned downstream of the ion beam scanner, wherein the angle corrector magnet parallelizes the scanned ion beam, therein defining a parallel shifted ion beam;

determining a shift of angle of the parallel shifted ion beam, wherein the shift angle is associated with a position of the ion beam scanner relative to the first Faraday cup and second Faraday cup;

varying the scanner voltage and determining the scanner voltage when a first peak and a second peak of the parallel shifted ion beam is present at the respective first Faraday cup and second Faraday cup; and determining a beam energy (E) of the parallel shifted ion beam, wherein the beam energy is defined by:

$$E=(\Delta\theta_2 q)/(K_2 \Delta V_{2S}), \text{ wherein:}$$

$\Delta\theta_2$ is the shift of angle of the parallel shifted ion beam;

q is a charge value of ions of the parallel shifted ion beam;

$K_2$ is approximately constant throughout ranges of beam energy and scanner voltage; and $\Delta V_{2S}$ is a difference in scanner voltages associated with the respective first and second peaks of the parallel shifted ion beam at the first Faraday cup and the second Faraday cup.

8. The beam energy identification system of claim 1, further comprising an angle corrector magnet positioned downstream of the electrostatic beam scanner, wherein the angle corrector magnet is configured to selectively parallelize the scanned ion beam.

* * * * *

UNITED STATES PATENT AND TRADEMARK OFFICE
CERTIFICATE OF CORRECTION

| | | |
|---|---|---|
| PATENT NO. | : 7,973,290 B2 | Page 1 of 1 |
| APPLICATION NO. | : 12/190736 | |
| DATED | : July 5, 2011 | |
| INVENTOR(S) | : Shu Satoh | |

It is certified that error appears in the above-identified patent and that said Letters Patent is hereby corrected as shown below:

Column 8, claim 1, line 26; please replace "$\Delta\theta_{1S}$ a shift of angle of the scanned ion beam;" with -- $\Delta\theta_{1S}$ is a shift of angle of the scanned ion beam; --

Column 9, claim 4, line 10; please replace "$E=(\Delta\theta_{2S}q)/(f_{2S}K_{2x}\Delta V_{2S})$, wherein:" with -- $E=(\Delta\theta_{2S}q)/(f_{2S}K_{2S}\Delta V_{2S})$, wherein: --

Signed and Sealed this
Sixteenth Day of August, 2011

David J. Kappos
*Director of the United States Patent and Trademark Office*